(12) United States Patent
Okamura et al.

(10) Patent No.: US 8,921,017 B2
(45) Date of Patent: Dec. 30, 2014

(54) MULTILAYER SUBSTRATE, MANUFACTURING METHOD FOR MULTILAYER SUBSTRATE, AND QUALITY CONTROL METHOD FOR MULTILAYER SUBSTRATE

(71) Applicant: Asahi Glass Company, Limited, Chiyoda-ku (JP)

(72) Inventors: Yuzo Okamura, Tokyo (JP); Yoshiaki Ikuta, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 14/021,392

(22) Filed: Sep. 9, 2013

(65) Prior Publication Data

US 2014/0011123 A1    Jan. 9, 2014

Related U.S. Application Data

(63) Continuation of application No. PCT/JP2012/055428, filed on Mar. 2, 2012.

(30) Foreign Application Priority Data

Mar. 7, 2011 (JP) .................. 2011-049414

(51) Int. Cl.
*G03F 1/44* (2012.01)
*G03F 1/24* (2012.01)

(52) U.S. Cl.
CPC ... *G03F 1/44* (2013.01); *G03F 1/24* (2013.01)
USPC ..................................... 430/5; 430/22; 430/30

(58) Field of Classification Search
CPC ..................................... G03F 1/24; G03F 1/44
USPC .................................................. 430/5, 22, 30
See application file for complete search history.

(56) References Cited

U.S. PATENT DOCUMENTS

| 7,911,600 B2 | 3/2011 | Terasawa et al. |
| 8,399,833 B2 * | 3/2013 | Yoshitake ..................... 250/307 |
| 2009/0091752 A1 | 4/2009 | Terasawa et al. |
| 2013/0078555 A1 * | 3/2013 | Orihara et al. .................... 430/5 |

FOREIGN PATENT DOCUMENTS

| JP | 2004-193269 A | 7/2004 |
| JP | 2004-266300 A | 9/2004 |
| JP | 2009-92407 A | 4/2009 |
| WO | WO 2008/129914 A1 | 10/2008 |
| WO | WO 2010/110237 A1 | 9/2010 |

OTHER PUBLICATIONS

International Search Report issued Jun. 5, 2012 in PCT/JP2012/055428 (English Translation only).

* cited by examiner

*Primary Examiner* — Christopher Young
(74) *Attorney, Agent, or Firm* — Oblon, Spivak, McClelland, Maier & Neustadt, L.L.P.

(57) ABSTRACT

The present invention relates to a multilayer substrate containing a substrate and a multilayer film provided on the substrate, in which a concave or convex fiducial mark that indicates a fiducial position of the multilayer substrate is formed on the surface of the multilayer film on the opposite side to the side of the substrate; and a material of at least a part of the surface of the fiducial mark is different from a material of a most superficial layer of the multilayer film on the opposite side to the side of the substrate.

20 Claims, 8 Drawing Sheets

MULTILAYER SUBSTRATE, MANUFACTURING METHOD FOR MULTILAYER SUBSTRATE, AND QUALITY CONTROL METHOD FOR MULTILAYER SUBSTRATE

TECHNICAL FIELD

The present invention relates to a multilayer substrate, a manufacturing method for a multilayer substrate, and a quality control method for a multilayer substrate.

BACKGROUND ART

In recent years, following the downsizing of semiconductor devices, the lithography technique (EUVL) using an EUV (Extreme Ultra-Violet) light having a shorter wavelength instead of the conventional ArF laser is considered promising. The EUV light as referred to herein means a light having a wavelength of a soft X-ray region or a vacuum ultraviolet ray region, and specifically, is a light having a wavelength of from about 0.2 to 100 nm. Currently, as a lithography light source, the use of the light having a wavelength in the vicinity of 13.5 nm is mainly investigated.

In addition, following the downsizing of semiconductor devices, a problem of defects on a photomask which is used in the lithography technique has been actualized, In particular, since the photomask is fabricated by subjecting a mask blank to pattern processing, a problem of defects on the mask blank has been actualized.

In order to avoid the problem of defects on the mask blank, there has been developed a technique for identifying a defect position on the mask blank and changing a position or direction of the processing pattern in accordance with the defect position. In addition, in order to identify the defect position on the mask blank, there has been proposed a technique for forming a concave fiducial mark that indicates a fiducial position of the mask blank (see, for example, Patent Document 1).

The mask blank is a multilayer substrate obtained by depositing a multilayer film on a substrate. In the mask blank for EUVL, the multilayer film includes a reflective layer that reflects an EUV light and an absorber layer that absorbs an EUV light in this order from the side of the substrate.

In the conventional methods, the defect position on the substrate is identified while taking a position of a fiducial mark formed on the substrate as a fiducial position. In addition, since the fiducial mark is transferred to the multilayer film to be deposited on the substrate, the defect position of each of functional layers constituting the multilayer film is identified while taking the position of the transferred fiducial mark as a fiducial position (see, for example, Patent Document 2).

RELATED ART DOCUMENTS

Patent Documents

Patent Document 1: WO 2010/110237
Patent Document 2: JP-A-2004-193269

SUMMARY OF THE INVENTION

Problems to be Solved by The Invention

Now, an electron beam lithography system which is used in the manufacturing step of a photomask detects a position of a fiducial mark which has been transferred to the uppermost layer of a multilayer film, by using reflected electron beams. In addition, a mask registration system and a mask inspection system which are used in the manufacturing step of a photomask detect reflected ultraviolet rays having a wavelength of from 190 to 400 nm to detect a position of a fiducial mark which has been transferred to the uppermost layer of a multilayer film.

However, in the conventional fiducial marks, it was difficult to detect the position of a concave fiducial mark by using reflected electron beams or reflected ultraviolet rays. This is because an edge of the fiducial mark to be transferred to a functional layer becomes round every time when the functional layer is stacked one by one. This is also because the inner bottom surface of the fiducial mark which has been transferred to the uppermost layer of the multilayer film and the uppermost layer of the multilayer film are constituted of the same material, and therefore, a difference in the intensity of reflected electron beams or in the intensity of reflected ultraviolet rays is small between a portion where the fiducial mark is present and a surrounding portion thereof. Patent Document 2 describes a multilayer film mask blank having a fiducial mark provided thereon, which is obtained by providing a concave in a part of the surface of a super-smooth substrate in advance and further accumulating a multilayer film thereon, and also describes that the fiducial mark formed on the substrate can be detected its pattern by electron beams. However, in the case of fabricating a mark on the substrate, there was involved such a problem that a detection signal becomes low, so that the required accuracy of detection position is hardly obtained.

In view of the foregoing problem, the present invention has been made, and objects thereof are to provide a multilayer substrate capable of detecting a fiducial position with good accuracy by reflected electron beams or reflected ultraviolet rays, a manufacturing method for the multilayer substrate, and a quality control method for the multilayer substrate.

Means for Solving the Problems

In order to accomplish the above objects, the present invention provides:

a multilayer substrate comprising a substrate and a multilayer film provided on the substrate, in which a concave or convex fiducial mark that indicates a fiducial position of the multilayer substrate is formed on the surface of the multilayer film on the opposite side to the side of the substrate; and a material of at least a part of the surface of the fiducial mark is different from a material of a most superficial layer of the multilayer film on the opposite side to the side of the substrate.

Further, the present invention provides:

a manufacturing method for a multilayer substrate comprising a substrate and a multilayer film provided on the substrate, which comprises:

a step of forming a concave or convex fiducial mark that indicates a fiducial position of the multilayer substrate on the surface of the multilayer film on the opposite side to the side of the substrate, in which a material of at least a part of the surface of the fiducial mark is different from a material of a most superficial layer of the multilayer film on the opposite side to the side of the substrate.

Further, the present invention provides:

a quality control method for a multilayer substrate comprising a substrate and a multilayer film provided on the substrate, with a concave or convex fiducial mark that indicates a fiducial position of the multilayer substrate being formed on the surface of the multilayer film on the opposite side to the side of the substrate, which comprises:

an identification step of identifying a defect position existing on the substrate before depositing the multilayer film on the substrate while taking a position of a concave or convex temporary fiducial mark existing on the substrate as a fiducial position, and/or identifying a defect position of at least one layer of the multilayer film on the way of depositing the multilayer film while taking a position of a concave or convex temporary fiducial mark existing on the substrate as a fiducial position;

a detection step of detecting a positional relation between the temporary fiducial mark and the fiducial mark; and a conversion step of converting the defect position identified in the identification step into a position that takes the position of the fiducial mark as the fiducial position on the basis of results of the detection step, in which a material of at least a part of the surface of the fiducial mark is different from a material of a most superficial layer of the multilayer film on the opposite side to the side of the substrate.

Furthermore, the present invention provides:

a quality control method for a multilayer substrate comprising a substrate and a multilayer film provided on the substrate, with a concave or convex fiducial mark that indicates a fiducial position of the multilayer substrate being formed on the surface of the multilayer film on the opposite side to the side of the substrate, which comprises:

an identification step of identifying a defect position existing on the substrate before depositing the multilayer film on the substrate while taking a position of a concave or convex temporary fiducial mark existing on the substrate as a fiducial position, and/or identifying a defect position of at least one layer of the multilayer film on the way of depositing the multilayer film while taking a position of a concave or convex temporary fiducial mark existing on the substrate as a fiducial position, in which the fiducial mark is formed so as to be superimposed on the temporary fiducial mark in a planar view, and a material of at least a part of the surface of the fiducial mark is different from a material of a most superficial layer of the multilayer film on the opposite side to the side of the substrate, Effect of the Invention According to the present invention, it is possible to provide a multilayer substrate capable of detecting a fiducial position with good accuracy by reflected electron beams or reflected ultraviolet rays, a manufacturing method for a multilayer substrate, and a quality control method for a multilayer substrate.

MODE FOR CARRYING OUT THE INVENTION

Figure 1:
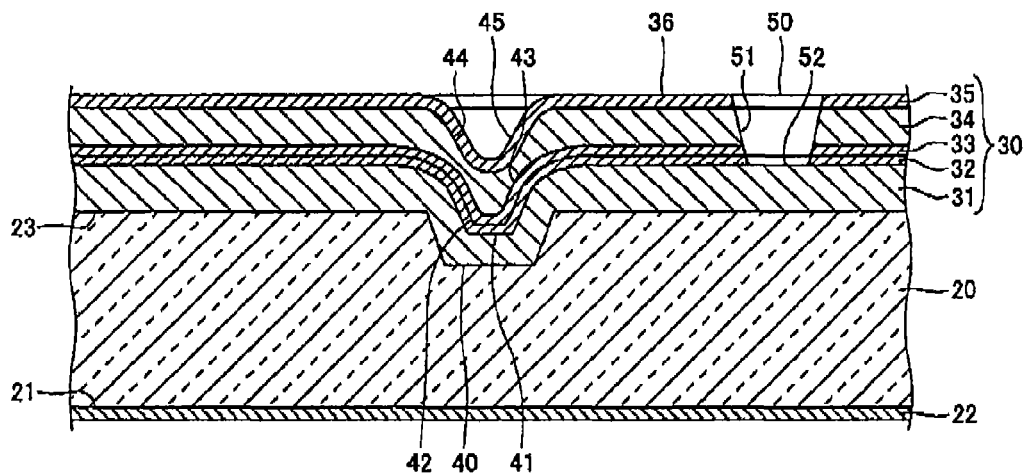
FIG. 1 is a cross-sectional view of a mask blank for EUVL according to the First embodiment of the present invention.

Modes for carrying out the present invention are hereunder described by reference to the accompanying drawings, In the drawings, the same or corresponding constitutions are given the same or corresponding symbols, and explanations thereof are omitted.

[First Embodiment]

Figure 2:
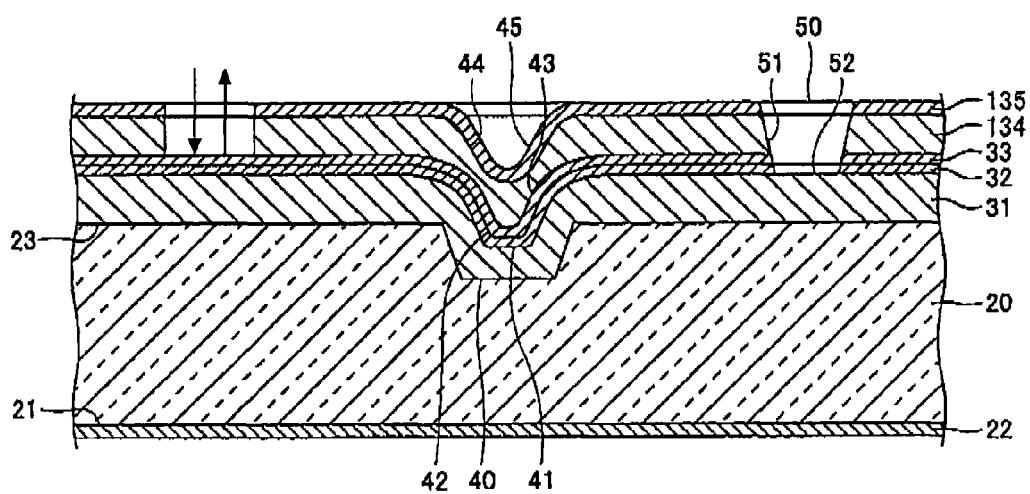
FIG. 2 is a cross-sectional view of an example of a photomask obtained by subjecting a mask blank to pattern processing.

FIG. 1 is a cross-sectional view of a mask blank for EUVL according to the First embodiment of the present invention. FIG. 2 is a cross-sectional view of an example of a photomask obtained by subjecting a mask blank to pattern processing.

For example, as shown in FIG. 1, a mask blank 10 for EUVL includes a substrate 20 and a multilayer film 30 formed on the substrate 20. The multilayer film 30 includes a reflective layer 31 that reflects an EUV light, a protective layer 32 that protects the reflective layer 31, a buffer layer 33 for pattern processing, an absorber layer 34 that absorbs an EUV light, and a low reflective layer 35 having a lower reflectivity to the inspection light than the absorber layer 34, in this order from the side of the substrate 20. Incidentally, the protective layer 32, the buffer layer 33, and the low reflective layer 35 are arbitrary constitutions, and the multilayer film 30 may not include the protective layer 32, the buffer layer 33, or the low reflective layer 35. The multilayer film 30 may further include other functional layer.

The mask blank 10 for EUVL is subjected to pattern processing in conformity with a general mask fabrication process and formed into a photomask 100 (see FIG. 2). For example, a resist film is coated on the multilayer film 30 of the mask blank 10 and heated, followed by drawing with electron beams or ultraviolet rays. At that time, a position or direction of a drawing pattern is adjusted in accordance with a defect position of at least one layer of the multilayer film 30 or a defect position existing on the substrate surface. Subsequently, an unnecessary portion of the absorber layer 34 or the low reflective layer 35 and the resist are removed by development and etching, whereby the photomask 100 is obtained.

The photomask 100 includes a low reflective layer 135 and an absorber layer 134 obtained by pattern processing of the low reflective layer 35 and the absorber layer 34 shown in FIG. 1. The EUV light irradiated on the photomask 100 is absorbed in a portion where the absorber layer 134 is present and reflected by the reflective layer 31 in a portion where the absorber layer 134 is not present. The EUV light reflected by the reflective layer 31 is subjected to image formation on the surface of an exposure material by an imaging optical system constituted of a concave mirror, etc., or the like.

Next, each of the constitutions of the mask blank 10 is described.

The substrate 20 is one on which the multilayer film 30 is deposited. RMS (Root Mean Square) that represents a surface roughness of the substrate 20 is, for example, not more than 0.15 nm, and a flatness of the substrate 20 is, for example, not more than 100 nm. It is required that the substrate 20 has a coefficient of thermal expansion being close to 0 in a temperature region where it is used for a mask blank, and for example, it is preferably within the range of $0\pm0.05\times10^{-7}/°$ C., and more preferably within the range of $0\pm0.03\times10^{-7}/°$ C.

The substrate 20 is constituted of a glass having excellent chemical resistance and heat resistance and having a small coefficient of thermal expansion. As the glass, for example, a quartz glass composed mainly of $SiO_2$ is used. The quartz glass may be one containing $TiO_2$. The content of $TiO_2$ is, for example, from 1 to 12 mass %. Also, the substrate 20 may be constituted of silicon, a metal, or the like other than the glass.

On a back surface 21 of the substrate 20 (surface on the side opposite to the surface on the side on which the multilayer film is formed), a conductive layer 22 for electrostatic chuck is formed. In the conductive layer 22, electrical conductivity of a constituent material thereof and thickness are chosen such that its sheet resistance is not more than 100 Ω/square. As the constituent material of the conductive layer 22, for example, Si, TiN, Mo, Cr, CrN, TaSi, or the like is used. Of these, preferred is a CrN film which is not only excellent in terms of adhesion to the chuck surface because of a small surface roughness of the surface of the conductive layer 22 but also excellent in terms of a chuck force because of a low sheet resistance of the conductive layer 22.

A thickness of the conductive layer 22 is, for example, from 10 to 1,000 nm.

As a deposition method for the conductive layer 22, a known deposition method, for example, a sputtering method such as a magnetron sputtering method and an ion beam sputtering method, a CVD method, a vacuum vapor deposition method, an electrolytic plating method, or the like is adopted.

The multilayer film 30 is deposited on a surface 23 of the substrate 20 (surface on the side on which the multilayer film is formed). A concave or convex temporary fiducial mark (in the present embodiment, a concave temporary fiducial mark) 40 that indicates a fiducial position of the substrate 20 is formed before depositing the multilayer film 30. Accordingly, a defect position of the substrate 20 is identified before depositing the multilayer film 30 (more specifically, before depositing a first layer, namely the reflective layer 31) while taking the position of the temporary fiducial mark 40 as a fiducial position, and can be recorded on a recording medium such as a magnetic recording medium, an optical recording medium, an electronic recording medium, and a paper.

Figure 3:
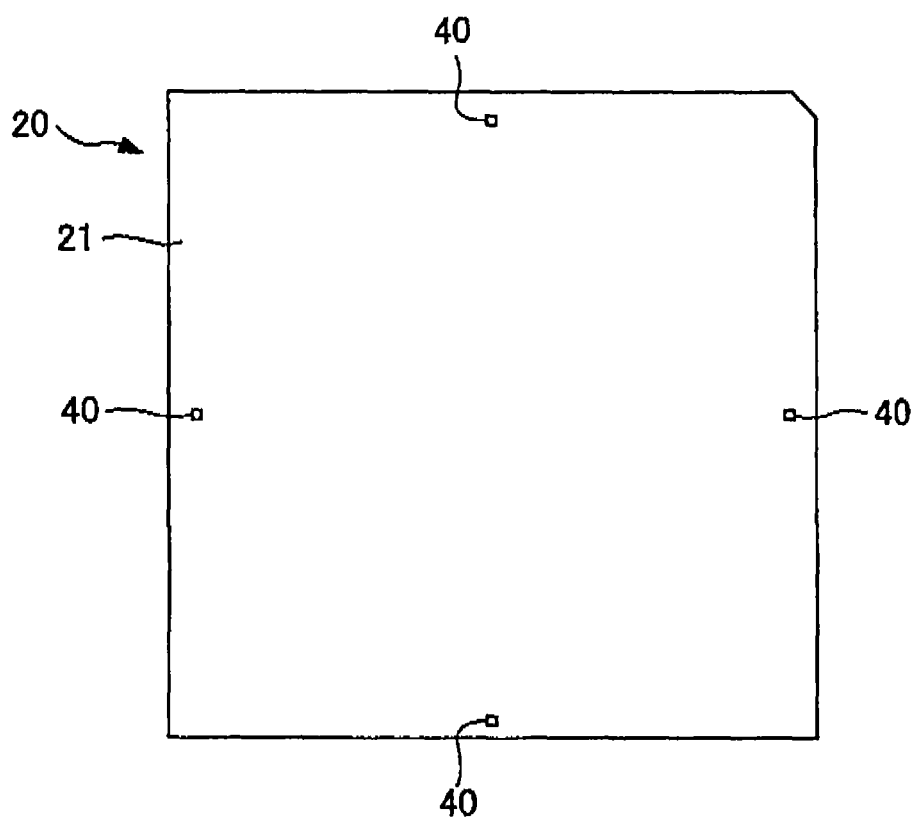
FIG. 3 is a plan view of an example of a substrate and a temporary fiducial mark.

FIG. 3 is a plan view of an example of a substrate and a temporary fiducial mark. As shown in FIG. 3, three or more (four in FIG. 3) of the temporary fiducial marks 40 are formed. The three or more temporary fiducial marks 40 are not disposed on the same straight line. Among three or more fiducial points, one fiducial point is the origin, a straight line connecting the origin to other one fiducial point is taken as X-axis, and a straight line connecting the origin to the remaining one fiducial point is taken as Y-axis, The X-axis and the Y-axis may be orthogonal to each other.

The temporary fiducial marks 40 are formed in a region that is not used in a subsequent step (e.g., a region that is not subjected to pattern processing in manufacturing step of a photomask). Specifically, they are formed in the periphery of the substrate 20.

As shown in FIG. 1, the temporary fiducial mark 40 is transferred to the reflective layer 31, the protective layer 32, the buffer layer 33, the absorber layer 34, and the low reflective layer 35 that are successively deposited on the substrate 20. Accordingly, it is possible to identify the defect positions (X-coordinates and Y-coordinates) of the respective layers 31 to 35 while taking positions of transferred temporary fiducial marks 41 to 45 as fiducial positions, thereby recording on a recording medium.

The recorded defect position information contributes to the manufacturing step of the photomask 100. Incidentally, as described later in detail, the defect position identified while taking the position of the temporary fiducial mark 40 (in more detail, the positions of the temporary fiducial marks 40 to 45) as the fiducial position is converted (coordinate-transformed) into a position that takes the position of a fiducial mark 50 as a fiducial position and then contributes to the manufacturing step of the photomask 100.

In the manufacturing step of the photomask 100, the defect position (including a depth) of the mask blank 10 can be known on the basis of information provided. For example, by changing the position or direction of the processing pattern of the absorber layer 34, or the like, the photomask 100 with a high quality can be manufactured. In addition, even a mask blank 10 that has hitherto been discarded because of inclusion of a defect in a part thereof can be submitted for the manufacturing step of the photomask 100.

The shape of the temporary fiducial mark 40 is, for example, a quadrangle as shown in FIG. 3, or a triangle, a circle, an oval, a lozenge, or the like in a planar view (seeing from the direction that is orthogonal to the surface 23 of the substrate 20); and it is, for example, a quadrangle as shown in FIG. 1, or a triangle, a half circle, or the like in a side view.

The size of the temporary fiducial mark 40 is, for example, not more than 200 nm, preferably not more than 70 nm, and more preferably not more than 50 nm in terms of a maximum length, and 10 nm or more and preferably 30 nm or more in terms of a minimum length in a planar view. A maximum depth of the concave temporary fiducial mark 40 is not more than 20 nm, preferably not more than 10 nm, and more preferably not more than 5 nm, and a minimum depth of the concave temporary fiducial mark 40 is 1 nm or more, and preferably 2 nm or more. So far as the temporary fiducial mark 40 having a size falling within this range is concerned, the position of the temporary fiducial mark 40 can be detected with good accuracy by a commercially available automated defect inspection system for mask blank or glass substrate, which uses ultraviolet light or visible light as a light source (for example, M7360, manufactured by Lasertec Corporation, or the like), and the defect position of at least one layer of the multilayer film 30 or the defect position existing on the surface 23 of the substrate 20 can be identified with sufficient accuracy.

The concave temporary fiducial mark 40 is formed by removing a part of the surface 23 of the substrate 20. As a removal method thereof, a laser abrasion method, an FIB (Focused Ion Beam) method, a nanoindentation method, a micromachining method (for example, a mechanical micromachining method using nm 450, manufactured by Rave LLC), a lithography method adopting patterning and etching of a resist, and the like can be adopted. In particular, an FIB method, a micromachining method, and a laser abrasion method are suitably adopted.

As the concave temporary fiducial mark 40, an actual defect existing on the surface 23 of the substrate 20, for example, a concave defect such as a pit generated by polishing or washing, can also be used.

Incidentally, a formation method for a convex temporary fiducial mark is described in the Second embodiment.

The reflective layer 31 is a layer that reflects an EUV light. In the photomask 100, the EUV light which has been irradiated in a portion where the absorber layer 134 is not present is reflected by the reflective layer 31. A maximum value of its reflectivity (light reflectivity at a wavelength in the vicinity of 13.5 nm) is, for example, 60% or more, and preferably 65% or more.

The reflective layer 31 has, for example, a multilayer structure in which a high refractive index layer and a low refractive index layer are alternately repeatedly stacked on each other. A Mo layer and a Si layer may be used for the high refractive index layer and the low refractive index layer, respectively. That is, the reflective layer 31 may be a Mo/Si multilayer reflective layer. A thickness of the Mo layer, a thickness of the Si layer, and the number of repeating time are properly set up. For example, the thickness of the Mo layer is 2.3±0.1 nm, the thickness of the Si layer is 4.5±0.1 nm, and the number of repeating time is from 30 to 60.

Incidentally, the reflective layer 31 is not particularly limited, and it may be, for example, a Ru/Si multilayer reflective layer, a Mo/Be multilayer reflective layer, a Mo compound/Si compound multilayer reflective layer, a Si/Mo/Ru multilayer reflective layer, a Si/Mo/Ru/Mo multilayer reflective layer, a Si/Ru/Mo/Ru multilayer reflective layer, or the like.

As a deposition method for the reflective layer 31, a deposition method such as a magnetron sputtering method and an ion beam sputtering method is adopted. In the case of forming a Mo/Si multilayer reflective layer adopting an ion beam sputtering method, a step of depositing a Mo layer by using a Mo target and a step of depositing a Si layer by using a Si target are alternately repeatedly performed.

The protective layer 32 is a layer playing a role to prevent the reflective layer 31 from being oxidized. As a material of the protective layer 32, Si, Ti, Ru, Rh, C, SiC, or a mixture of such an element or compound, a material obtained by adding N, O, B, etc. to such an element or compound, and the like can be used.

In the case of using Ru as the material of the protective layer 32, a layer thickness of the protective layer can be thinned to 2 to 3 nm, and a function of the buffer layer 33 as described later can be also served simultaneously, and hence, such is especially preferable. In addition, in the case where the reflective layer 31 is a Mo/Si multilayer reflective layer, by forming the uppermost layer by a Si layer, the uppermost layer can be allowed to function as a protective layer. In that case, it is preferable to regulate a layer thickness of the Si layer that is the uppermost layer to from 5 to 15 nm, a value of which is thicker than usual 4.5 nm. In addition, in that case, a Ru film that serves both the protective layer and the buffer layer may also be deposited on the Si layer that is the uppermost layer. Incidentally, the protective layer 32 is not always required to be a single layer but may be made of two or more layers.

As a deposition method for the protective layer 32, a deposition method such as a magnetron sputtering method and an ion beam sputtering method is adopted.

As described later in detail, the buffer layer 33 plays a role as a so-called etching stopper that prevents the reflective layer 31 from being damaged by an etching process (in general, a dry etching process) of the absorber layer 34 in the manufacturing step of the photomask 100.

As a material of the buffer layer 33, a material which is hardly affected by the etching process of the absorber layer 34, namely is slower in an etching rate thereof than the absorber layer 34, and is hardly damaged by this etching process is chosen. Examples of a substance that satisfies such a requirement include $SiO_2$, $Si_3N_4$, $Al_2O_3$, and mixtures thereof as well as Cr, Al, Ru, Ta, and nitrides thereof. Of these, Ru, CrN, and $SiO_2$ are preferable, and CrN and Ru are more preferable. Ru is especially preferable because it serves the both functions as the protective layer 32 and the buffer layer 33.

A film thickness of the buffer layer 33 is preferably from 1 to 60 nm.

As a deposition method for the buffer layer 33, a well-known deposition method such as a magnetron sputtering method and an ion beam sputtering method is adopted.

The absorber layer 34 is a layer that absorbs an EUV light. A characteristic which is particularly required for the absorber layer 34 is to adjust the intensity and phase of the reflected light from the absorber layer 34 such that a pattern formed on the photomask 100 for EUV is precisely transferred to a resist film on a wafer via a projection optical system of an EUVL exposure machine.

A specific method thereof includes two kinds of method. First one is a method for making the intensity of the reflected light from the absorber layer 34 small as far as possible, in which the film thickness and material of the absorber layer 34 are adjusted such that a reflectivity of the EUV light from the surface of the absorber layer 34 is not more than 1%, and especially not more than 0.7%. Second one is a method for utilizing an interference effect between the reflected light from the reflective layer 31 and the reflected light from the absorber layer 34 (low reflective layer in the case where the low reflective layer is formed on the surface of the absorber layer), in which the film thickness and material of the absorber layer 34 (low reflective layer in the case where the low reflective layer is formed on the surface of the absorber layer) are adjusted such that a reflectivity of the EUV light from the absorber layer 34 (low reflective layer in the case where the low reflective layer is formed on the surface of the absorber layer) is from 5 to 15%, and a retardation between the reflected light from the reflective layer 31 and the reflected light from the absorber layer 34 (low reflective layer in the case where the low reflective layer is formed on the surface of the absorber layer) is from 175° to 185°.

In all of these methods, a material constituting the absorber layer 34 is preferably a material containing Ta in an amount of 40 atom % or more, preferably 50 atom % or more, and more preferably 55 atom % or more. It is preferable that the material composed mainly of Ta, which is used for the absorber layer 34, contains, in addition to Ta, at least one or more kinds of element among Hf, Si, Zr, Ge, B, Pb, H, and N.

Specific examples of the material containing the foregoing element other than Ta include TaN, TaNH, TaHf, TaHfN, TaBSi, TaBSiN, TaB, TaBN, TaSi, TaSiN, TaGe, TaGeN, TaZr, TaZrN, TaPd, and TaPdN. However, it is preferable that oxygen is not contained in the absorber layer 34.

Specifically, the content of oxygen in the absorber layer 34 is preferably less than 25 atom %. At the time of fabricating the photomask 100 for EUV by forming a mask pattern in the absorber layer 34 of the mask blank, in general, a dry etching process is adopted. As an etching gas, a chlorine gas (including a mixed gas) or a fluorine based gas (including a mixed gas) is usually used.

For the purpose of preventing the reflective layer 31 from being damaged by the etching process, in the case of forming a film containing Ru or an Ru compound as the protective layer 32 on the reflective layer 31, a chlorine gas is chiefly used as the etching gas of the absorber layer 34 in view of the fact that it scarcely damages the protective layer 32. However, in the case of carrying out the dry etching process of the absorber layer 34 by using a chlorine gas, if the absorber layer 34 contains oxygen, the etching rate is lowered, and the damage of the resist film becomes large, and hence, such is not preferable. The content of oxygen in the absorber layer 34 is more preferably not more than 15 atom %, still more preferably not more than 10 atom %, and especially preferably not more than 5 atom %.

In the case of the foregoing first method, namely in order to regulate the reflectivity of the EUV light from the surface of the absorber layer 34 to not more than 1%, and especially not more than 0.7%, a thickness of the absorber layer 34 is preferably 60 nm or more, and especially preferably 70 nm or more. In the case of the foregoing second method, it is preferably in the range of from 40 nm to 60 nm, and especially preferably in the range of from 45 nm or 55 nm.

As a deposition method for the absorber layer 34, a deposition method such as a magnetron sputtering method and an ion beam sputtering method is adopted.

In the manufacturing step of the photomask 100, the absorber layer 34 is subjected to pattern processing and formed into the absorber layer 134.

The low reflective layer 35 is a layer having a lower reflectivity to an inspection light for inspecting the pattern shape of the absorber layer 134 shown in FIG. 2 than the absorber layer 34. In general, a light having a wavelength of about 257 nm is used as the inspection light.

The inspection of the pattern shape of the absorber layer 134 is performed utilizing the fact that a reflectivity of the inspection light is different between a portion where the absorber layer 134 is present and a portion where the absorber layer 134 is not present. In the portion where the absorber layer 134 is not present, in general, the protective layer 32 is exposed.

In the portion where the absorber layer 134 is present, when the low reflective layer 135 is stacked, the difference in the reflectivity of the inspection light becomes large between a portion where the absorber layer 134 is present and a portion where the absorber layer 134 is not present, and therefore, the inspection accuracy is enhanced.

The low reflective layer 35 is constituted of a material whose refractive index at a wavelength of the inspection light is lower than that of the absorber layer 34. Specifically, there is exemplified a material composed mainly of Ta, In addition, it is preferred to contain, in addition to Ta, at least one or more kinds of element among Hf, Ge, Si, B, N, H, and O. Specific examples thereof include TaO, TaON, TaONH, TaBO, TaHfO, TaHfON, TaBSiO, TaBSiON, SiN, and SiON.

In the case of forming the low reflective layer 35 on the absorber layer 34, a total thickness of the absorber layer 34 and the low reflective layer 35 is preferably from 10 to 65 nm, more preferably from 30 to 65 nm, and further preferably from 35 to 60 nm. In addition, if the layer thickness of the low reflective layer 35 is thicker than the layer thickness of the absorber layer 34, there is a concern that EUV light absorption characteristics in the absorber layer 34 are lowered. Therefore, it is preferable that the layer thickness of the low reflective layer 35 is thinner than the layer thickness of the absorber layer 34. Therefore, the thickness of the low reflective layer 35 is preferably from 1 to 20 nm, more preferably from 3 to 15 nm, and further preferably from 5 to 10 nm.

As a deposition method for the low reflective layer 35, a deposition method such as a magnetron sputtering method and an ion beam sputtering method is adopted.

In addition, the multilayer film 30 may include a functional layer such as a hard mask. The hard mask is formed on the surface of the absorber layer 34 (low reflective layer 35 in the case where the low reflective layer 35 is formed on the absorber layer 34 and the hard mask does not have a function of the low reflective layer 35), and the dry etching rate is slow as compared with that in the absorber layer 34 and/or the low reflective layer 35. Therefore, the film thickness of the resist film can be made thin, and a finer pattern can be fabricated. As a material of such a hard mask, $Cr_2O_3$, Ru, Cr(N,O), and the like can be used, and a film thickness thereof is preferably from 2 to 10 nm.

On a surface 36 (surface on the opposite side to the side of the substrate 20) of the multilayer film 30 having the foregoing constitution, the fiducial mark 50 in a concave or convex shape (in the present embodiment, a concave shape), which indicates a fiducial position of the mask blank 10, is formed. Since the fiducial mark 50 is formed after depositing the multilayer film 30, its edge is sharp and its side wall angle is steep as compared with the temporary fiducial mark 45 transferred to the uppermost layer of the multilayer film 30 (most superficial layer on the opposite side to the side of the substrate 20), and it can be detected with good accuracy.

Figure 4:
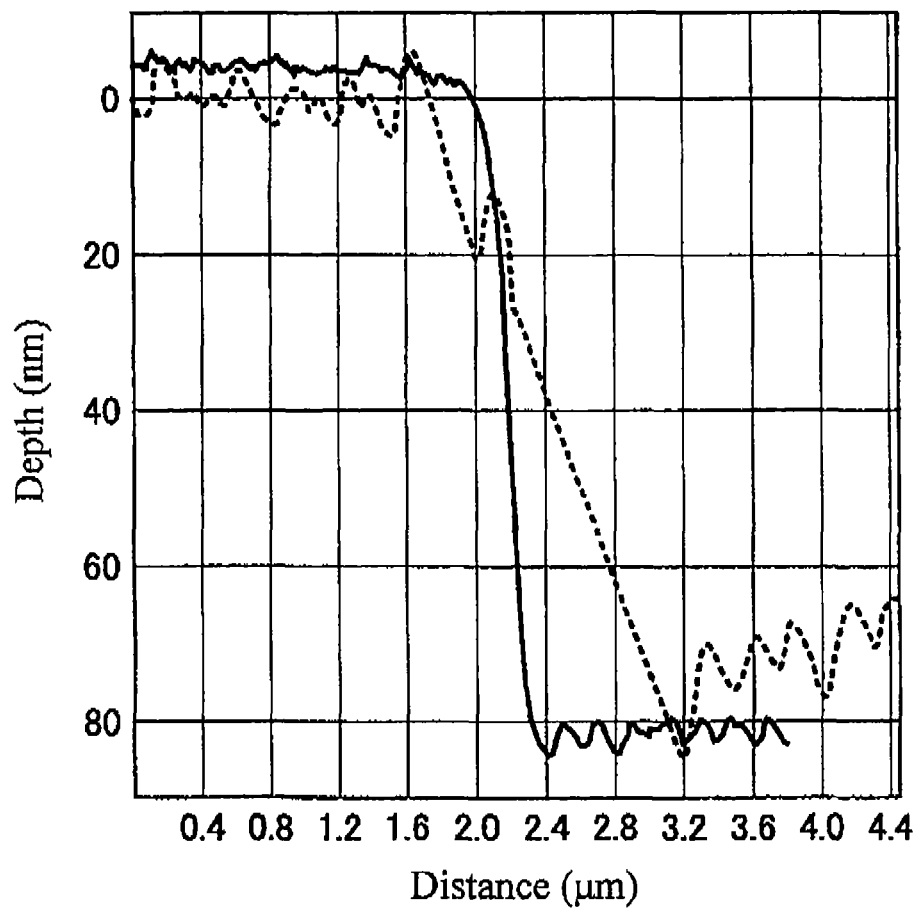
FIG. 4 is a diagram showing an example of a cross-sectional profile of a concave fiducial mark and a cross-sectional profile of a concave temporary fiducial mark transferred to an uppermost layer of a multilayer film.

FIG. 4 is a diagram showing an example of a cross-sectional profile of a concave fiducial mark and a cross-sectional profile of a concave temporary fiducial mark transferred to the uppermost layer of a multilayer film. In FIG. 4, the solid line shows an example of a cross-sectional profile of a concave fiducial mark, and the broken line shows an example of a cross-sectional profile of a concave temporary fiducial mark transferred to the uppermost layer of a multilayer film. In the case shown in FIG. 4, a reflective layer (stack of 40 layers of Mo/Si, thickness: about 280 nm), a protective layer (Ru layer having a thickness of 2.5 nm), an absorber layer (TaN layer having a thickness of 51 nm), and a low reflective layer (TaON layer having a thickness of 7 nm) are stacked in this order on a $TiO_2$-doped quartz glass substrate, A depth of the temporary fiducial mark formed on the substrate and a depth of the fiducial mark formed on the low reflective layer were each regulated to about 80 nm. It is noted from FIG. 4 that the cross-sectional profile of the concave fiducial mark is steeper than the cross-sectional profile of the concave temporary fiducial mark transferred to the uppermost layer of the multilayer film.

Figure 5:
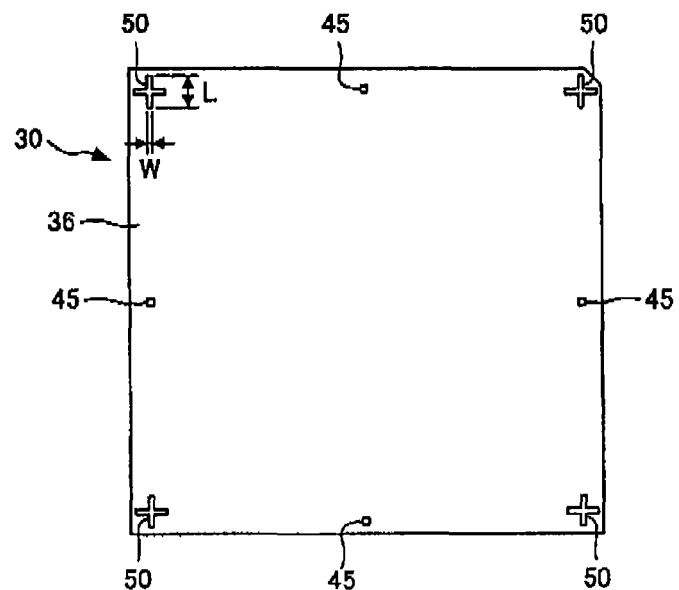
FIG. 5 is a plan view of an example of a mask blank and a fiducial mark.

FIG. 5 is a plan view of an example of a mask blank and a fiducial mark.

The fiducial mark 50 is formed in a shape in accordance with the purpose. For example, as shown in FIG. 5, it is formed in a cross shape in a planar view (seeing from the direction that is orthogonal to the surface 36). A point of intersection of a center line of one straight line portion with a center line of the remaining straight line portion is the fiducial point. For example, each of the straight line portions has a width W of from 4.5 to 5.5 μm and a length L of from 100 to 500 μm.

The fiducial mark 50 is formed in the number of three or more. The three or more fiducial marks 50 are not disposed on the same straight line. Among three or more fiducial points, one fiducial point is the origin, a straight line connecting the origin to other one fiducial point is X-axis, and a straight line connecting the origin to the remaining one fiducial point is Y-axis. The X-axis and the Y-axis may be orthogonal to each other.

The fiducial marks 50 are formed in a region that is not used in a subsequent step (e.g., a region that is not subjected to pattern processing in the manufacturing step of a photomask) on the surface 36 of the multilayer film 30. Specifically, they are formed in the periphery of the multilayer film 30.

It is preferable that the concave fiducial mark 50 has a stepped surface 51 that is substantially perpendicular to the surface 36 of the multilayer film 30 and an offset surface (inner bottom surface) 52 that is substantially parallel to the surface 36 of the multilayer film 30 such that an edge thereof is sharp.

The concave fiducial mark 50 is formed by removing a part of the surface 36 of the multilayer film 30. As a removal method thereof, a laser abrasion method, an FIB (Focused Ion Beam) method, a lithography method adopting patterning and etching of a resist, a nanoindentation method, a micromachining method (for example, a mechanical micromachining method using nm 450, manufactured by Rave LLC), and the like can be adopted. In particular, an FIB method and a lithography method are suitably adopted.

Incidentally, a formation method for a convex fiducial mark is described in the Second embodiment.

As shown in FIG. 1, the concave fiducial mark 50 is formed so as to penetrate at least the uppermost layer (most superficial layer on the opposite side to the side of the substrate 20) of the multilayer film 30. Accordingly, a part (offset surface 52) of the surface (stepped surface 51 and offset surface 52) of the concave fiducial mark 50 is constituted of a material different from that of the uppermost layer of the multilayer film 30, and therefore, the position of the fiducial mark 50 can be detected with good accuracy. This effect is particularly conspicuous in the case of detecting the position of the fiducial mark 50 by using reflected electron beams or reflected ultraviolet rays. This is because the intensity of a reflected electron image is strong in terms of a contrast due to a difference of material as compared with that of a secondary electron image. In addition, the intensity of the reflected ultraviolet rays relies upon the kind of a material or the like, so a strong contrast can be obtained due to a difference of material.

Figure 6:
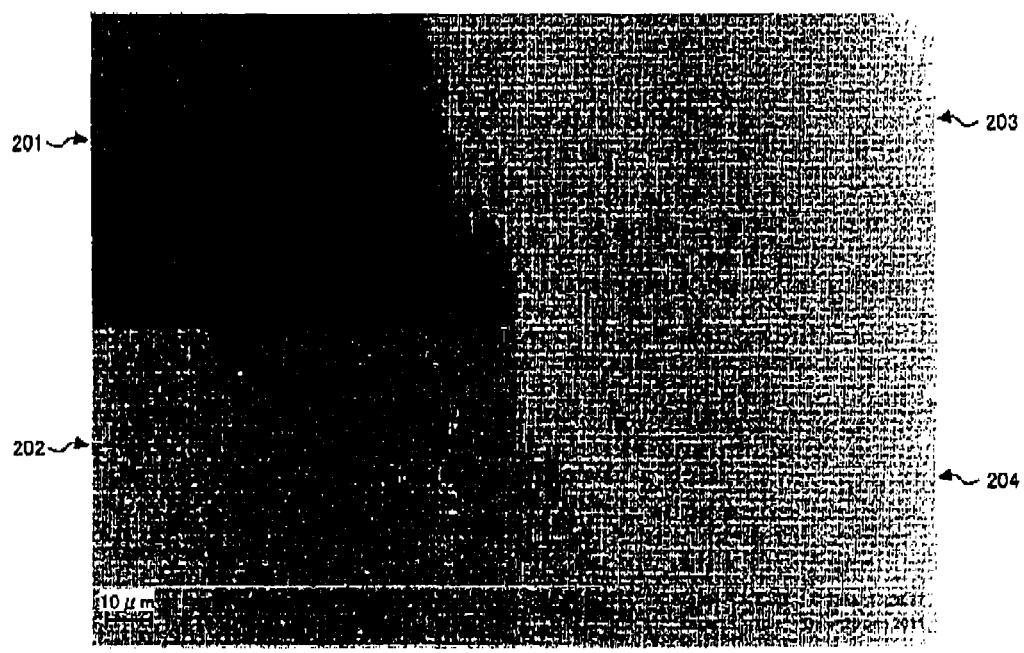
FIG. 6 is an explanatory view of a difference in contrast of a reflected electron image (SEM photograph) due to a difference of material.

FIG. 6 is an explanatory view of a difference in contrast of a reflected electron image (SEM photograph) due to a difference of material. A multilayer substrate shown in FIG. 6 is one obtained by forming a reflective layer on a substrate and forming an absorber layer on the reflective layer. The substrate is a TiO$_2$-doped quartz glass substrate, the reflective layer is a Mo/Si multilayer reflective layer, and the absorber layer is a TaN layer. In FIG. 6, a left upper portion 201 is a reflected electron image of a portion in which the absorber layer is not stacked on the reflective layer and the reflective layer is exposed; and a left lower portion 202 is a reflected electron image of a portion in which the absorber layer having a thickness of 35 nm is stacked on the reflective layer. In addition, in FIG. 6, a right upper portion 203 is a reflected electron image of a portion in which the absorber layer having a thickness of 77 nm is stacked on the reflective layer; and a right lower portion 204 is a reflected electron image of a portion in which the absorber layer having a thickness of 112 nm is stacked on the reflective layer. It is noted from FIG. 6 that in the reflected electron image, the contrast due to a difference of material is stronger than the contrast due to concave and convex.

In order to make the contrast in the reflected electron image strong, it is preferable that a difference between the number of protons of a material constituting the inner bottom surface 52 of the concave fiducial mark 50 and the number of protons of a material constituting the uppermost layer of the multilayer film 30 is sufficiently large.

Figure 7:
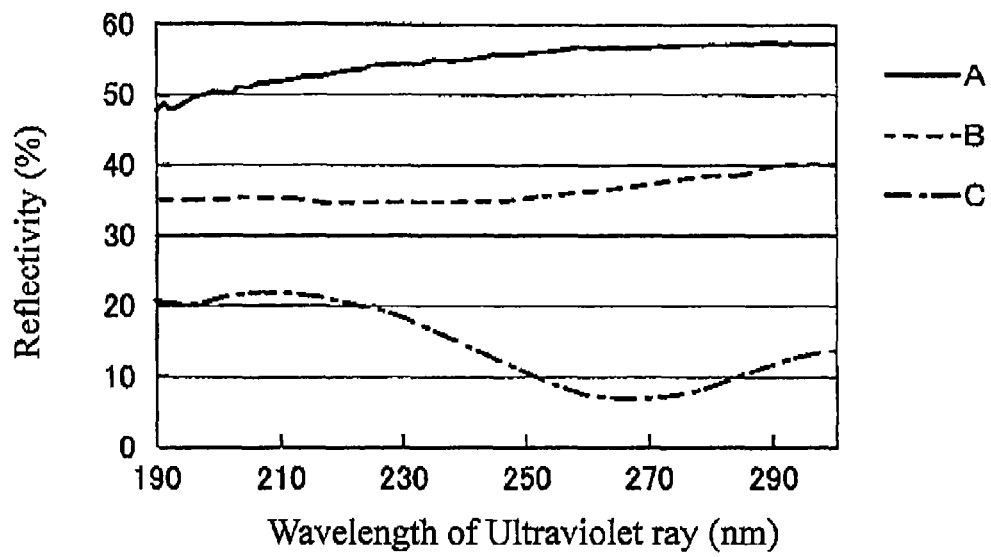
FIG. 7 is an explanatory view of a difference in ultraviolet-region reflectivity spectrum due to a difference of material.

FIG. 7 is an explanatory view of a difference in ultraviolet-region reflectivity spectrum due to a difference of material. In FIG. 7, A is a spectrum of a multilayer substrate in which a reflective layer (stack of 40 layers of Mo/Si) is formed on a substrate; B is a spectrum of a multilayer substrate in which a reflective layer (stack of 40 layers of Mo/Si) and an absorber layer (TaN layer having a thickness of 77 nm) are stacked on a substrate; and C is a spectrum of a multilayer substrate in which a reflective layer (stack of 40 layers of Mo/Si, thickness: about 280 nm), an absorber layer (TaN layer having a thickness of 77 nm), and a low reflective layer (TaON layer having a thickness of 7 nm) are stacked on a substrate. As for the three kinds of multilayer substrate, the ultraviolet-region reflectivity is different from-each other. It is noted that in the case where the material constituting the inner bottom surface 52 of the concave fiducial mark 50 is different from the material constituting the uppermost layer of the multilayer film 30, it is easy to detect the fiducial mark 50 by the reflected ultraviolet rays while utilizing a contrast due to the difference in ultraviolet-region reflectivity.

As shown in FIG. 1, the concave fiducial mark 50 may also be formed so as to penetrate the absorber layer 34 in addition to the low reflective layer 35. This is because in many cases, the low reflective layer 35 and the absorber layer 34 are constituted of a material analogous to each other.

As shown in FIG. 1, the concave fiducial mark 50 may also be formed so as to penetrate the buffer layer 33 in addition to the low reflective layer 35 and the absorber layer 34 and may also be formed so as to penetrate the buffer layer 33 and the protective layer 32. Incidentally, the concave fiducial mark 50 may also be formed so as to penetrate the reflective layer 31 in further addition to the protective layer 32.

In the present embodiment, though the inner bottom surface 52 of the concave fiducial mark 50 is present in the reflective layer 31, it may be present in any of the absorber layer 34, the buffer layer 33, the protective layer 32, or the substrate 20, or may also be present over a plurality of functional layers.

Though a depth of the concave fiducial mark 50 is properly set up in accordance with the thickness of the low reflective layer 35, the absorber layer 34, the buffer layer 33, the protective layer 32, or the reflective layer 31, or the like, it is, for example, from 2 to 300 nm, preferably from 7 to 150 nm, and more preferably from 40 to 120 nm.

The case where the uppermost layer of the multilayer film 30 is the low reflective layer 35 has been described in the present embodiment, but the uppermost layer may be the absorber layer 34 while omitting the low reflective layer 35. In that case, the concave fiducial mark 50 is formed so as to penetrate the absorber layer 34, and it may also be formed so as to penetrate the protective layer 32 or the reflective layer 31 in addition to the absorber layer 34. The inner bottom surface 52 of the concave fiducial mark 50 may contain any one of the buffer layer 33, the protective layer 32, the reflective layer 31, and the substrate 20, or may also be present over a plurality of the functional layers.

[Second Embodiment]

In the foregoing First embodiment, the temporary fiducial mark and the fiducial mark are formed in a concave shape.

In contrast, in the present embodiment, the temporary fiducial mark and the fiducial mark are formed in a convex shape.

A constitution of a mask blank according to the present embodiment is hereunder described. Since the constitution exclusive of the shapes of the temporary fiducial mark and the fiducial mark is the same as the constitution of the First embodiment, a description thereof is omitted.

Figure 8:
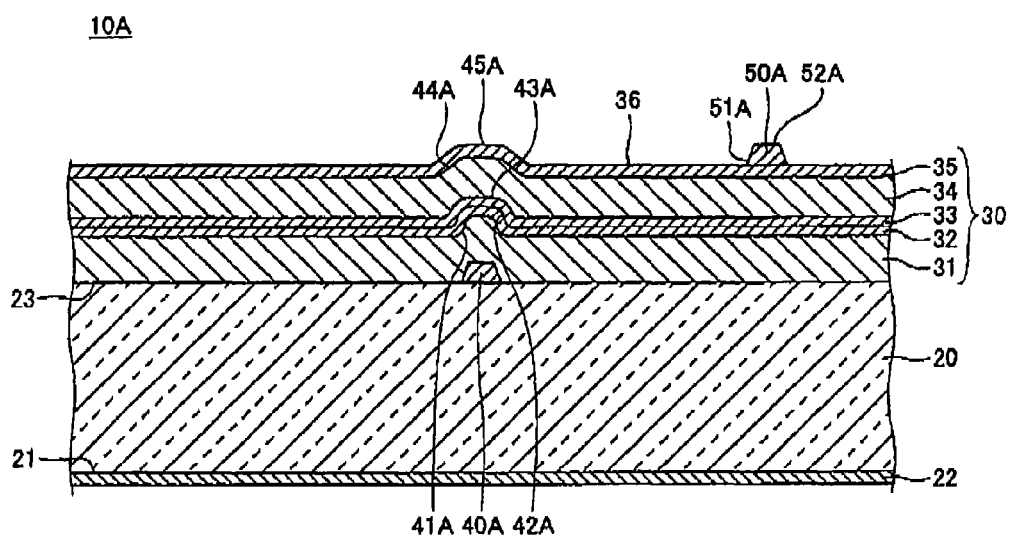
FIG. 8 is a cross-sectional view of a mask blank for EUVL according to the Second embodiment of the present invention.

FIG. 8 is a cross-sectional view of a mask blank for EUVL according to the Second embodiment of the present invention.

A convex temporary fiducial mark 40A is formed before depositing the multilayer film 30 on the surface 23 of the substrate 20. Accordingly, a defect position of the substrate 20 is identified before depositing the multilayer film 30 (in more detail, before depositing a first layer, namely the reflective layer 31) while taking the position of the temporary fiducial mark 40A as a fiducial position, and can be recorded on a recording medium such as a magnetic recording medium, an optical recording medium, an electronic recording medium, and a paper.

The shape of the convex temporary fiducial mark 40A is, for example, a quadrangle, a triangle, a circle, an oval, a lozenge, or the like in a planar view (seeing from the direction that is orthogonal to the surface 23 of the substrate 20); and it is, for example, a quadrangle as shown in FIG. 8, or a triangle, a half circle, or the like in a side view.

The size of the convex temporary fiducial mark 40A is, for example, not more than 200 nm, preferably not more than 70 nm, and more preferably not more than 50 nm in terms of a maximum length, and 10 nm or more and preferably 30 nm or more in terms of a minimum length in a planar view. A maximum height of the temporary fiducial mark 40A is not more than 20 nm, preferably not more than 10 nm and more preferably not more than 5 nm, and a minimum height of the temporary fiducial mark 40A is 1 nm or more and preferably 2 nm or more. So far as the temporary fiducial mark 40A having a size falling within this range is concerned, the position of the temporary fiducial mark 40A can be detected with good accuracy by a commercially available automated defect inspection system for mask blank or glass substrate, which uses ultraviolet light or visible light as a light source (for example, M7360, manufactured by Lasertec Corporation, or the like), and the defect position of at least one layer of the multilayer film 30 or the defect position existing on the surface 23 of the substrate 20 can be identified with sufficient accuracy.

The convex temporary fiducial mark 40A is formed by depositing a film locally on the surface 23 of the substrate 20. As a specific method thereof, there is a method in which a suitable gas is chosen depending upon a material to be accumulated, and ion beams or electron beams are irradiated in an atmosphere containing a metal compound of platinum, tungsten, or the like (for example, hexacarbonyl tungsten) or a hydrocarbon compound (e.g., naphthalene, phenanthrene, etc.) to promote a decomposition reaction of the metal compound, thereby locally accumulating a metal film.

Incidentally, as the convex temporary fiducial mark 40A, an actual defect existing on the surface 23 of the substrate 20, for example, a convex defect such as a particle attached onto the surface derived from washing or an environment, can also be used.

As shown in FIG. 8, the temporary fiducial mark 40A is transferred to the reflective layer 31, the protective layer 32, the buffer layer 33, the absorber layer 34, and the low reflective layer 35 that are successively deposited on the substrate 20. Accordingly, it is possible to identify the defect positions (X-coordinates and Y-coordinates) of the respective layers 31 to 35 while taking positions of transferred temporary fiducial marks 41A to 45A as fiducial positions, thereby recording on the recording medium.

The recorded defect position information contributes to the manufacturing step of a photomask. Incidentally, as described in the Fourth embodiment in detail, the defect position identified while taking the position of the temporary fiducial mark 40A (in more detail, the positions of the temporary fiducial marks 40A to 45A) as the fiducial position is converted into a position that takes the position of a fiducial mark 50A as a fiducial position and then contributes to the manufacturing step of a photomask.

In the manufacturing step of a photomask, the defect position (including a height) of a mask blank WA can be known on the basis of information provided. For example, by changing the position or direction of the processing pattern of the absorber layer 34, or the like, a photomask with a high quality can be manufactured. In addition, even a mask blank 10A which has hitherto been discarded because of inclusion of a defect in a part thereof can be submitted for the manufacturing step of a photomask.

The convex fiducial mark 50A is formed on the surface (surface on the opposite side to the side of the substrate 20) 36 of the multilayer film 30. Since the fiducial mark 50A is formed after depositing the multilayer film 30, its edge is sharp as compared with the temporary fiducial mark 45A transferred to the uppermost layer of the multilayer film 30, and it can be detected with good accuracy.

The convex fiducial mark 50A is formed in a shape in accordance with the purpose. For example, similar to the First embodiment, it is formed in a cross shape in a planar view (seeing from the direction that is orthogonal to the surface 36). A point of intersection of a center line of one straight line portion with a center line of the remaining straight line portion is the fiducial point.

The convex fiducial mark 50A is formed in the number of three or more. The three or more convex fiducial marks 50A are not disposed on the same straight line. Among three or more fiducial points, one fiducial point is the origin, a straight line connecting the origin to other one fiducial point is X-axis, and a straight line connecting the origin to the remaining one fiducial point is Y-axis. The X-axis and the Y-axis may be orthogonal to each other.

The convex fiducial marks 50A are formed in a region that is not used in a subsequent step on the surface 36 of the multilayer film 30 (e.g., a region that is not subjected to pattern processing in the manufacturing step of a photomask). Specifically, they are formed in the periphery of the multilayer film 30.

It is preferable that the convex fiducial mark 50A has a stepped surface 51A that is substantially perpendicular to the surface 36 of the multilayer film 30 and an offset surface 52A that is substantially parallel to the surface 36 of the multilayer film 30 such that an edge thereof is sharp and a side wall angle thereof is steep.

Though a height of the convex fiducial mark 50A is properly set up in accordance with the material or thickness of the uppermost layer of the multilayer film 30, or the like, it is, for example, from 2 to 300 nm, preferably from 7 to 150 nm, and more preferably from 40 to 120 nm.

The convex fiducial mark 50A is formed by stacking on the uppermost layer of the multilayer film 30 a material that is different from that of the uppermost layer. Specifically, there are a method for depositing on the uppermost layer a film of a material that is different from that of the uppermost layer and processing it by means of lithography; and a method for locally depositing on the uppermost layer a material that is different from that of the uppermost layer. As the latter method, there is a method in which a suitable gas is chosen depending upon a material to be accumulated, and ion beams or electron beams are irradiated in an atmosphere containing a metal compound of platinum, tungsten, or the like (for example, hexacarbonyl tungsten) or a hydrocarbon compound (e.g., naphthalene, phenanthrene, etc.) to promote a decomposition reaction of the metal compound, thereby locally accumulating a metal film.

Accordingly, since the surfaces 51A and 52A of the fiducial mark 50A are constituted of a material that is different from that of the uppermost layer of the multilayer film 30, the position of the fiducial mark 50A can be detected with good accuracy, This effect is particularly conspicuous in the case of detecting the position of the fiducial mark 50A by using reflected electron beams or reflected ultraviolet rays. This is because the intensity of the reflected electron rays is strong in terms of a contrast due to a difference of material as compared with that of a secondary electron image. In addition, this is because the intensity of the reflected ultraviolet rays relies upon the kind of a material or the like, and a strong contrast can be obtained due to a difference of material.

The case where the uppermost layer of the multilayer film 30 is the low reflective layer 35 has been described in the present embodiment, but the uppermost layer may be the absorber layer 34 while omitting the low reflective layer 35.

[Third Embodiment]

The present embodiment is concerned with a manufacturing method for the mask blank 10. Incidentally, a manufacturing method for the mask blank 10A is also the same.

Figure 9:
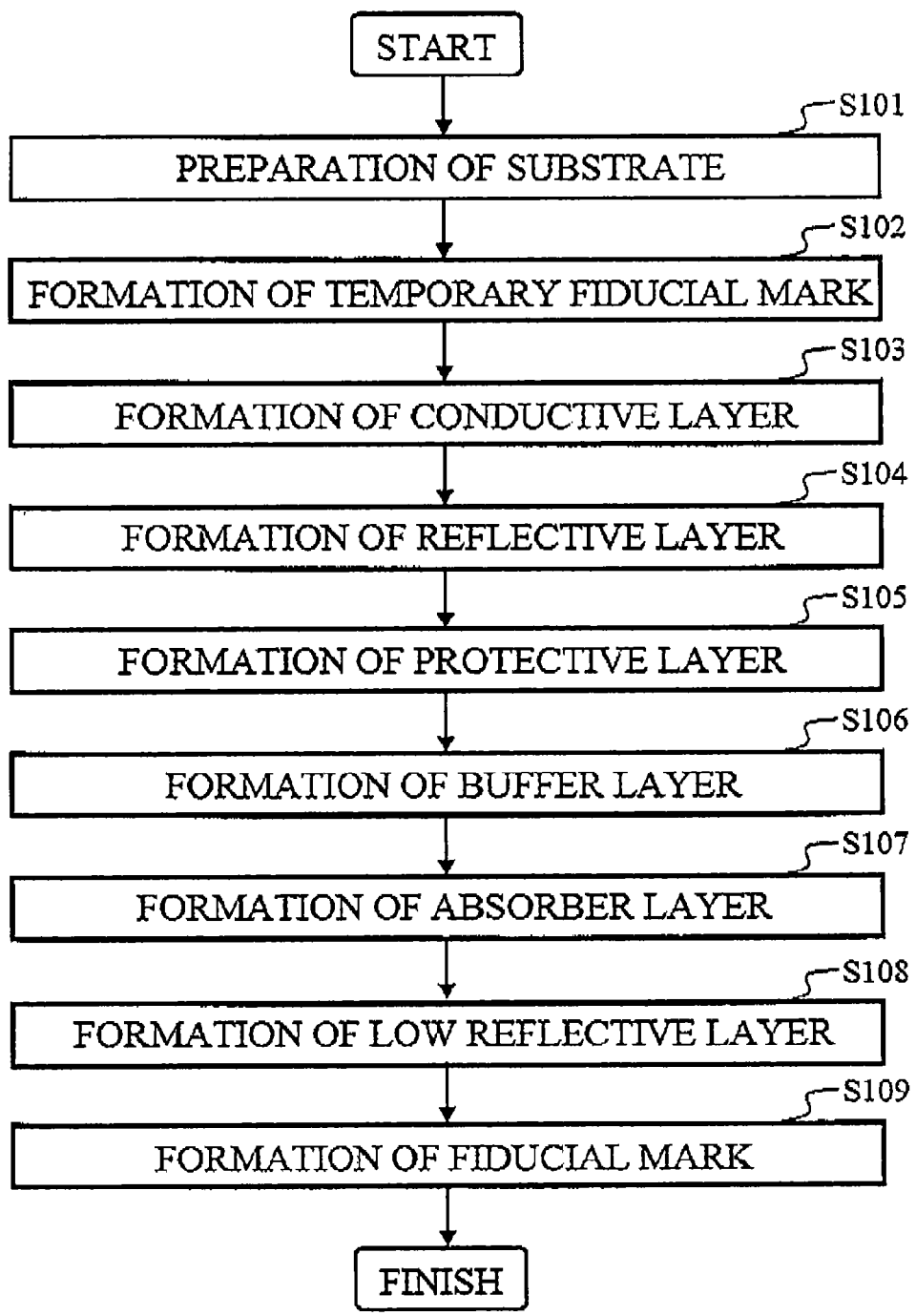
FIG. 9 is a flowchart of a manufacturing method for a mask blank according to the Third embodiment of the present invention.

FIG. 9 is a flowchart of a manufacturing method for a mask blank according to the Third embodiment of the present invention.

The manufacturing method for the mask blank 10 include a step S101 of preparing the substrate 20; a step S102 of forming the temporary fiducial mark 40 on the surface 23 of the substrate 20; a step S103 of depositing the conductive layer 22 on the back surface 21 of the substrate 20; steps S104 to S108 of depositing the multilayer film 30 on the surface 23 of the substrate 20; and a step S109 of forming the fiducial mark 50 on the surface 36 of the multilayer film 30. Among the respective steps S101 to S109, a washing step, a drying step, or the like may be provided.

The steps of depositing the multilayer film 30 include, for example, the step S104 of forming the reflective layer 31 on the surface 23 of the substrate 20; the step S105 of forming the protective layer 32 on the reflective layer 31; the step S106 of forming the buffer layer 33 on the protective layer 32; the step S107 of forming the absorber layer 34 on the buffer layer 33; and the step S108 of forming the low reflective layer 35 on the absorber layer 34.

Incidentally, the manufacturing method for the mask blank 10 may not include the step S102 of forming the temporary fiducial mark 40. In that case, a concave or convex defect existing on the surface 23 of the substrate 20 is used as the temporary fiducial mark.

In addition, the step S103 of forming the conductive layer 22 may be performed after the steps S104 to S108 of depositing the multilayer film 30, and there is no restriction on the order thereof.

[Fourth Embodiment]

The present embodiment is concerned with a quality control method for the mask blank 10. Incidentally, a quality control method for the mask blank 10A is also the same.

Figure 10:
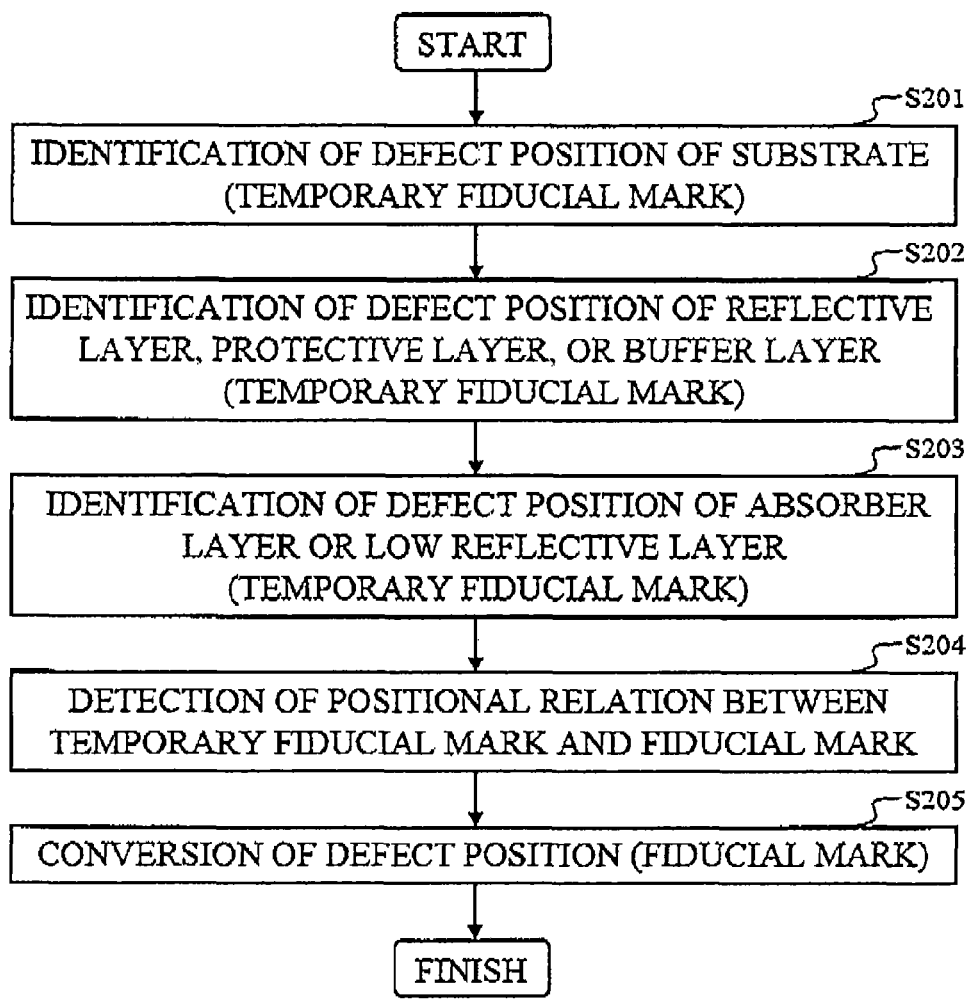
FIG. 10 is a flowchart of a quality control method for a mask blank according to the Fourth embodiment of the present invention.

FIG. 10 is a flowchart of a quality control method for a mask blank according to the Fourth embodiment of the present invention.

The quality control method for the mask blank 10 includes a first identification step S201 of identifying a defect position of the surface 23 of the substrate 20 while taking the position of the temporary fiducial mark 40 as a fiducial position.

In order to enhance the identification accuracy, the first identification step S201 is performed before the steps S104 to S108 (see FIG. 9) of depositing the multilayer film 30 on the surface 23 of the substrate 20 (in more detail, before the step S104 of depositing the first layer). Incidentally, since the first identification step S201 utilizes the temporary fiducial mark 40, this step is performed after the step S102 (see FIG. 9) of forming the temporary fiducial mark 40.

In the first identification step S201, not only the defect position is identified, but also the type of defect (for example, distinction between concave and convex) may be identified. Information on the defect is recorded in a recording medium. Incidentally, in the case where no defect is present, information of the contents that no defect is present is recorded in a recording medium.

A method for identifying the defect position may be a general one. Examples thereof include a method in which a spot light such as ultraviolet rays, vacuum ultraviolet rays or soft X-rays is scanned on the surface of a test body (substrate 20), and a scattered light from the test body is received, thereby identifying the defect position. A reflected light or a transmitted light may be used in place of the scattered light.

The quality control method for the mask blank 10 may further include a second identification step S202 of identifying a defect position of at least one layer of the multilayer film 30 on the way of depositing the multilayer film 30 while taking the position of the temporary fiducial mark 40 as a fiducial position.

For example, as shown in FIG. 10, the second identification step S202 may also be a step of identifying a defect position of the reflective layer 31, the protective layer 32 and the buffer layer 33. In that case, as the position of the temporary fiducial mark 40, the position of the temporary fiducial mark 43 transferred on the buffer layer 33 is used.

The second identification step S202 is performed after the steps S104, S105 and S106 (see FIG. 9) of forming the reflective layer 31, the protective layer 32 and the buffer layer 33, respectively, and before the step S107 (see FIG. 9) of forming the absorber layer 34.

Incidentally, in many cases, the reflective layer 31, the protective layer 32, and the buffer layer 33 are in general continuously deposited. Therefore, it has been denoted that the defect positions are identified together. However, the present invention is not limited thereto, For example, the defect position of the reflective layer 31 may also be identified before forming the protective layer 32, and the defect position of the protective layer 32 may also be identified before forming the buffer layer 33.

In the second identification step S202, not only the defect position is identified, but also the type of defect (for example, distinction between concave and convex) may be identified. Information on the defect is recorded in a recording medium. Incidentally, in the case where no defect is present, information of the contents that no defect is present is recorded in a recording medium.

A method for identifying the defect position may be the same method as the method which is adopted in the first identification step S201.

The quality control method for the mask blank 10 may further include a third identification step S203 of identifying a defect position of another layer of the multilayer film 30 while taking the position of the temporary fiducial mark 40 as a fiducial position.

For example, as shown in FIG. 10, the third identification step S203 may also be a step of identifying defect positions of the absorber layer 34 and the low reflective layer 35. In that case, as the position of the temporary fiducial mark 40, the position of the temporary fiducial mark 45 transferred on the low reflective layer 35, is used.

The third identification step S203 is performed after the step S108 (see FIG. 9) of forming the low reflective layer 35 and before the step S109 (see FIG. 9) of forming the fiducial mark 50.

Incidentally, in many cases, the absorber layer 34 and the low reflective layer 35 are in general continuously deposited. Therefore, it has been denoted that the defect positions are identified together. However, the present invention is not limited thereto.

For example, the defect position of the absorber layer 34 may also be identified before forming the low reflective layer 35.

In the third identification step S203, not only the defect position is identified, but also the type of defect (for example, distinction between concave and convex) may be identified. Information on the defect is recorded in a recording medium. Incidentally, in the case where no defect is present, information of the contents that no defect is present is recorded in a recording medium.

A method for identifying the defect position may be the same method as the method which is adopted in the first identification step S201.

The quality control method for the mask blank 10 further includes a detection step S204 of detecting a positional relation between the position of the temporary fiducial mark 40 (in more detail, the position of the temporary fiducial mark 45 transferred to the uppermost layer of the multilayer film 30) and the position of the fiducial mark 50. Since the detection step S204 utilizes the fiducial mark 50, this step is performed after the step S109 (see FIG. 9) of forming the fiducial mark 50.

A method for detecting the positional relation between the position of the temporary fiducial mark 45 and the position of the fiducial mark 50 may be the same as the identification method for a defect position adopted in the first identification step S201.

The quality control method for the mask blank 10 further includes a conversion step S205 of converting the defect position identified by the first to third identification steps S201 to S203 into a position that takes the position of the fiducial mark 50 as a fiducial position on the basis of detection results in the detection step S204. Information on the defect position as identified while taking the position of the fiducial mark 50 as a fiducial position is recorded in a recording medium and used in the manufacturing step of the photomask 100.

In this way, according to the present embodiment, since, in the first identification step S201, the defect position of the substrate 20 is identified before depositing the multilayer film 30 on the substrate 20, the identification accuracy is good. In addition, since, in the second identification step S202, the defect position of at least one layer of the multilayer film 30 is identified on the way of depositing the multilayer film 30, the identification accuracy is good.

Incidentally, it has been denoted that the quality control method according to the present embodiment involves both the first identification step S201 and the second identification step S202, but it may include only either one of these steps. So long as one of these steps is included, the identification accuracy is enhanced.

The identified defect position is converted into a position that takes the position of the fiducial mark 50 as a fiducial position on the basis of the positional relation between the temporary fiducial mark 40 and the fiducial mark 50 and contributes to the manufacturing step of the photomask 100.

An electron beam drawing system, a mask registration system, and a mask inspection system which are used in the manufacturing step of the photomask 100 are able to detect reflected electron beams or reflected ultraviolet rays, thereby detecting the position of the fiducial mark 50 with good accuracy, Thus, the defect position can be known with good accuracy on the basis of information provided from a supply source of the mask blank 10.

Incidentally, in the quality control method according to the present embodiment, though it has been denoted that the third identification step S203 of identifying the defect positions of the absorber layer 34 and the low reflective layer 35 is carried out before the step S109 (see FIG. 9) of forming the fiducial mark 50, it may also be carried out after the step S109. In that case, in the third identification step S203, the defect position can be identified while taking the position of the fiducial mark 50 as a fiducial position in place of the temporary fiducial mark 40, and the identification accuracy is enhanced,

[Fifth Embodiment]

In the foregoing First embodiment, the fiducial mark 50 is formed at a position that is sufficiently far from the temporary fiducial mark 40.

In contrast, in the present embodiment, the fiducial mark is formed so as to be superimposed on the temporary fiducial mark in a planar view.

A constitution of a mask blank according to the present embodiment is hereunder described. Since the constitution exclusive of the shapes of the temporary fiducial mark and the fiducial mark is the same as the constitution of the First embodiment, a description thereof is omitted.

Figure 11:
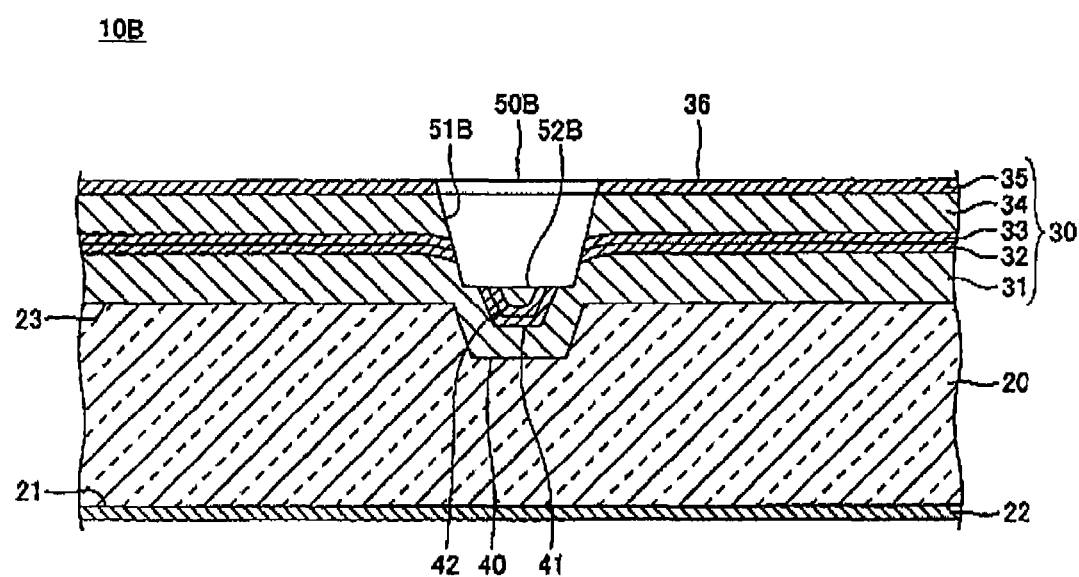
FIG. 11 is a cross-sectional view of a mask blank for EUVL according to the Fifth embodiment of the present invention.

FIG. 11 is a cross-sectional view of a mask blank for EUVL according to the Fifth embodiment of the present invention.

The temporary fiducial mark 40 is formed in a concave or convex shape (in the present embodiment, a concave shape) on the surface 23 of the substrate 20. In addition, a fiducial mark 50B is formed in a concave or convex shape (in the present embodiment, a concave shape) on the surface 36 of the multilayer film 30, and is formed so as to be superimposed on the temporary fiducial mark 40 in a planar view.

Accordingly, in the quality control method for the mask blank 10A, the detection step S204 (see FIG. 10) of detecting a positional relation between the temporary fiducial mark 40 and the fiducial mark 50A and the conversion step S205 (see FIG. 10) which is performed subsequent to the detection step S204 are unnecessary.

As shown in FIG. 11, the concave fiducial mark 50B is formed so as to penetrate at least the uppermost layer (most superficial layer on the opposite side to the side of the substrate 20) of the multilayer film 30. Accordingly, similar to the foregoing First embodiment, a surface 51B and a part of 52B of the fiducial mark 50B are constituted of a material that is different from that of the uppermost layer of the multilayer film 30, Therefore, the position of the fiducial mark 50B can be detected with good accuracy by reflected electron beams or reflected ultraviolet rays.

On the inner bottom surface 52B of the concave fiducial mark 50B, the reflective layer 31, the protective layer 32, the buffer layer 33, and the absorber layer 34 may be exposed due to the influence of the temporary fiducial mark 40.

While the First to Fifth embodiments according to the present invention have been described, the present invention is not limited to these embodiments. Various changes and modifications can be made in these embodiments without departing from the scope of the present invention.

For example, while it has been denoted that the multilayer substrate according to the foregoing embodiments is a mask blank for EUVL, it is not particularly limited thereto so long as it is able to detect the fiducial position by using reflected electron beams, reflected ultraviolet rays, soft X-rays, or the like.

In addition, in the foregoing embodiments, the combination of the shape of a temporary fiducial mark with the shape of a fiducial mark is not limited. A combination of a convex temporary fiducial mark with a concave fiducial mark may also be used, and a combination of a concave temporary fiducial mark with a convex fiducial mark may also be used.

The present application is based on a Japanese patent application No, 2011-049414 filed on Mar. 7, 2011, and the contents of which are incorporated herein by reference.

DESCRIPTION OF REFERENCE NUMERALS AND SIGNS

10: Multilayer substrate (mask blank for EUVL)
20: Substrate
30: Multilayer film
31: Reflective layer
32: Protective layer
33: Buffer layer
34: Absorber layer
35: Low reflective layer
36: Surface of multilayer film
40: Temporary fiducial mark
50: Fiducial mark
51: Stepped surface of fiducial mark
52: Offset surface (inner bottom surface) of fiducial mark
100: Photomask

The invention claimed is:

1. A multilayer substrate, comprising:
a substrate; and
a multilayer film formed on the substrate,
wherein the multilayer film has a fiducial mark formed such that the fiducial mark indicates a fiducial position of the multilayer substrate, and the fiducial mark has a concave structure formed in the multilayer substrate and comprising one of a plurality of stacked layers forming the multilayer film different from a most superficial layer of the multilayer film such that the one of the stacked layers exposed in the multilayer film comprises a material different from a material of the most superficial layer and is forming a surface of the concave structure or a convex structure formed on a surface of the most superficial layer of the multilayer film such that the convex structure has a surface portion comprising a material different from the material of the most superficial layer.

2. The multilayer substrate according to claim 1, wherein the fiducial mark has the concave structure penetrating through at least the most superficial layer of the multilayer film.

3. The multilayer substrate according to claim 1, wherein the fiducial mark has the convex structure comprising the material different from the material of the most superficial layer stacked on the most superficial layer of the multilayer film.

4. The multilayer substrate according to claim 1, wherein the multilayer film includes a reflective layer that reflects an EUV light and an absorber layer that absorbs an EUV light in an order of the reflective layer and the absorber layer from a side of the substrate.

5. The multilayer substrate according to claim 2, wherein the multilayer film includes a reflective layer that reflects an EUV light and an absorber layer that absorbs an EUV light in an order of the reflective layer and the absorber layer from a side of the substrate.

6. The multilayer substrate according to claim 3, wherein the multilayer film includes a reflective layer that reflects an EUV light and an absorber layer that absorbs an EUV light in an order of the reflective layer and the absorber layer from a side of the substrate.

7. A manufacturing method for a multilayer substrate comprising:
forming a multilayer film on a substrate; and
forming a fiducial mark in or on the multilayer film such that the fiducial mark indicates a fiducial position of the multilayer substrate,
wherein the forming of the fiduciary mark comprises forming a concave structure in the multilayer film such that the fiducial mark comprises one of a plurality of stacked layers forming the multilayer film different from a most superficial layer of the multilayer film and that the one of the stacked layers exposed in the multilayer film comprises a material different from a material of the most superficial layer and is forming a surface of the concave structure or forming a convex structure on a surface of the most superficial layer of the multilayer film such that the convex structure has a surface portion comprising a material different from the material of the most superficial layer.

8. The manufacturing method for a multilayer substrate according to claim 7, wherein the fiducial mark has the concave structure penetrating through at least the most superficial layer of the multilayer film.

9. The manufacturing method for a multilayer substrate according to claim 7, wherein the fiducial mark has the convex structure comprising the material different from the material of the most superficial layer stacked on the most superficial layer of the multilayer film.

10. The manufacturing method for a multilayer substrate according to claim 7, wherein the multilayer film includes a reflective layer that reflects an EUV light and an absorber layer that absorbs an EUV light in this order from the side of the substrate.

11. The manufacturing method for a multilayer substrate according to claim 8, wherein the multilayer film includes a reflective layer that reflects an EUV light and an absorber layer that absorbs an EUV light in an order of the reflective layer and the absorber layer from a side of the substrate.

12. The manufacturing method for a multilayer substrate according to claim 9, wherein the multilayer film includes a reflective layer that reflects an EUV light and an absorber layer that absorbs an EUV light in an order of the reflective layer and the absorber layer from a side of the substrate.

13. A quality control method for a multilayer substrate, comprising:
identifying a defect position existing on a substrate before forming a multilayer film on the substrate while taking a position of a temporary fiducial mark existing on the substrate as a fiducial position;
forming the multilayer film on the substrate such that a defect position of at least one layer of the multilayer film is identified while taking the position of the temporary fiducial mark as a fiducial position;
forming a fiducial mark in or on the multilayer film such that the fiducial mark indicates a fiducial position of the multilayer substrate;
detecting a positional relation between the temporary fiducial mark and the fiducial mark; and
converting at least one of the defect position on the substrate and the defect position in the multilayer film into a position that takes the fiducial position of the fiducial mark based on the positional relation between the temporary fiducial mark and the fiducial mark,
wherein the forming of the fiduciary mark comprises forming a concave structure in the multilayer film such that the fiduciary mark comprises one of a plurality of stacked layers forming the multilayer film different from a most superficial layer of the multilayer film and that the one of the stacked layers exposed in the multilayer film comprises a material different from a material of the most superficial layer and is forming a surface of the concave structure or forming a convex structure on a surface of the most superficial layer of the multilayer film such that the convex structure has a surface portion comprising a material different from the material of the most superficial layer.

14. A quality control method for a multilayer substrate, comprising:
identifying a defect position existing on a substrate before forming a multilayer film on the substrate while taking a position of a temporary fiducial mark existing on the substrate as a fiducial position;
forming the multilayer film on the substrate such that a defect position of at least one layer of the multilayer film is identified while taking the position of the temporary fiducial mark as a fiducial position and
forming a fiducial mark in or on the multilayer film such that the fiducial mark indicates a fiducial position of the multilayer substrate,
wherein the fiducial mark is formed such that the fiducial mark is superimposed on the temporary fiducial mark in a planar view, and the forming of the fiduciary mark comprises forming a concave structure in the multilayer film such that the fiduciary mark comprises one of a plurality of stacked layers forming the multilayer film different from a most superficial layer of the multilayer film and that the one of the stacked layers exposed in the multilayer film comprises a material different from a material of the most superficial layer and is forming a surface of the concave structure or forming a convex structure on a surface of the most superficial layer of the multilayer film such that the convex structure has a surface portion comprising a material different from the material of the most superficial layer.

15. The quality control method for a multilayer substrate according to claim 13, wherein the fiducial mark has the concave structure penetrating through at least the most superficial layer of the multilayer film.

16. The quality control method for a multilayer substrate according to claim 13, wherein the fiducial mark has the convex structure comprising the material different from the material of the most superficial layer stacked on the most superficial layer of the multilayer film.

17. The quality control method for a multilayer substrate according to claim 13, wherein the multilayer film includes a reflective layer that reflects an EUV light and an absorber layer that absorbs an EUV light in an order of the reflective layer and the absorber layer from a side of the substrate.

18. The quality control method for a multilayer substrate according to claim 14, wherein the fiducial mark has the concave structure penetrating through at least the most superficial layer of the multilayer film.

19. The quality control method for a multilayer substrate according to claim 14, wherein the fiducial mark has the convex structure comprising the material different from the material of the most superficial layer stacked on the most superficial layer of the multilayer film.

20. The quality control method for a multilayer substrate according to claim 14, wherein the multilayer film includes a reflective layer that reflects an EUV light and an absorber layer that absorbs an EUV light in an order of the reflective layer and the absorber layer from a side of the substrate.

* * * * *